United States Patent
Chen et al.

(10) Patent No.: US 10,578,271 B1
(45) Date of Patent: Mar. 3, 2020

(54) VEHICLE LED LINEAR LIGHTING MODULE

(71) Applicant: EXCELLENCE OPTOELECTRONICS INC., Miaoli County (TW)

(72) Inventors: Yu-Chu Chen, Miaoli County (TW); Jhen-Cyun Lyu, Miaoli County (TW); Sheng-Hua Yang, Miaoli County (TW)

(73) Assignee: EXCELLENCE OPTOELECTRONICS INC., Miaoli County (TW)

( * ) Notice: Subject to any disclaimer, the term of this patent is extended or adjusted under 35 U.S.C. 154(b) by 0 days.

(21) Appl. No.: 16/387,129

(22) Filed: Apr. 17, 2019

(51) Int. Cl.
| | |
|---|---|
| *H01L 33/54* | (2010.01) |
| *F21S 43/249* | (2018.01) |
| *H01L 33/62* | (2010.01) |
| *H01L 33/58* | (2010.01) |
| *H01L 25/075* | (2006.01) |
| *F21S 43/20* | (2018.01) |
| *F21S 43/239* | (2018.01) |
| *F21Y 115/10* | (2016.01) |
| *F21W 121/00* | (2006.01) |
| *F21W 103/55* | (2018.01) |
| *F21Y 103/10* | (2016.01) |

(52) U.S. Cl.
CPC .......... *F21S 43/249* (2018.01); *F21S 43/239* (2018.01); *F21S 43/26* (2018.01); *H01L 25/0753* (2013.01); *H01L 33/54* (2013.01); *H01L 33/58* (2013.01); *H01L 33/62* (2013.01); *F21W 2103/55* (2018.01); *F21W 2121/00* (2013.01); *F21Y 2103/10* (2016.08); *F21Y 2115/10* (2016.08)

(58) Field of Classification Search
CPC ...... H01L 25/0753; H01L 33/54; H01L 33/58
USPC .......................................................... 362/511
See application file for complete search history.

(56) References Cited

U.S. PATENT DOCUMENTS

| | | |
|---|---|---|
| 5,375,043 A | 12/1994 | Tokunaga |
| 9,976,710 B2 | 5/2018 | Meir |
| (Continued) | | |

FOREIGN PATENT DOCUMENTS

| | | |
|---|---|---|
| CN | 202158410 U | 3/2012 |
| CN | 205979313 U | 2/2017 |
| (Continued) | | |

OTHER PUBLICATIONS

Extended European Search Report for related EP App No. 191712843 dated Nov. 26, 2019, 11 pgs.

*Primary Examiner* — Christopher M Raabe
(74) *Attorney, Agent, or Firm* — Procopio, Cory, Hargreaves & Savitch LLP

(57) ABSTRACT

A vehicle LED linear lighting module is provide, including at least one printed circuit board, at least one light bar, an optical colloid and a light conductor. The light bar is disposed on the printed circuit board and composed of a plurality of light emitting diodes in a linear lighting and arranged with equal pitches. The optical colloid has a first optical surface, a second optical surface and a third optical surface, and covers the plurality of light emitting diodes in a full coverage. By using different optical surfaces of the optical colloid and the arrangement of the light incident surface and the light exit surface of the optical conductor, the light strip can greatly improve the light effect.

11 Claims, 12 Drawing Sheets

(56) References Cited

U.S. PATENT DOCUMENTS

| | | | |
|---|---|---|---|
| 2003/0086276 A1* | 5/2003 | Ohtsuka | B60Q 1/2607 362/511 |
| 2005/0023545 A1* | 2/2005 | Camras | H01L 33/58 257/98 |
| 2008/0260329 A1 | 10/2008 | Epstein | |
| 2009/0262517 A1* | 10/2009 | Suehiro | G02B 6/0023 362/84 |
| 2010/0110679 A1* | 5/2010 | Teng | F21K 9/00 362/235 |
| 2011/0007513 A1* | 1/2011 | Zhang | G02B 27/0927 362/311.02 |
| 2011/0249462 A1* | 10/2011 | Koizumi | B60Q 1/302 362/519 |
| 2014/0151731 A1* | 6/2014 | Tran | H01L 33/50 257/98 |
| 2014/0321141 A1* | 10/2014 | Bauer | B60Q 1/085 362/511 |
| 2015/0078024 A1* | 3/2015 | Mugge | F21S 43/14 362/511 |
| 2015/0367773 A1* | 12/2015 | Matsumaru | B60Q 1/2619 362/516 |
| 2016/0084462 A1* | 3/2016 | Suwa | F21S 41/143 362/511 |
| 2016/0107563 A1* | 4/2016 | Reinprecht | B60Q 1/0052 362/511 |
| 2016/0116666 A1* | 4/2016 | Sato | G02B 6/002 362/509 |
| 2016/0161091 A1* | 6/2016 | Beaumont | F21V 7/05 362/308 |
| 2017/0276310 A1* | 9/2017 | Nakazawa | B60Q 1/0035 |

FOREIGN PATENT DOCUMENTS

| | | |
|---|---|---|
| CN | 206055236 U | 3/2017 |
| CN | 206504276 U | 9/2017 |
| CN | 207067439 U | 3/2018 |
| CN | 107895755 A | 4/2018 |
| DE | 20115772 U1 | 4/2002 |
| DE | 102011119379 A1 | 5/2013 |
| DE | 102015204303 A1 | 9/2015 |
| EP | 2161494 B1 | 3/2010 |
| EP | 2387187 A1 | 10/2011 |
| JP | 03008384 U | 1/1991 |
| JP | 2008047851 A | 2/2008 |
| TW | 201025672 A | 7/2010 |
| TW | I369463 B1 | 8/2012 |
| TW | I370216 B1 | 8/2012 |
| TW | M474657 U | 3/2014 |
| TW | 201734600 A | 10/2017 |

* cited by examiner

VEHICLE LED LINEAR LIGHTING MODULE

CROSS REFERENCE TO RELATED APPLICATIONS

This Paris Convention Patent Application claims benefit under 35 U.S.C. § 119 and claims priority to Taiwanese Patent Application No. TW107147184, filed on Dec. 26, 2018, the content of which is incorporated herein in its entirety by reference for all purposes.

BACKGROUND

1. Technical Field

The present invention relates to a vehicle LED linear lighting module, in particular, to a lighting module of vehicle headlights having flexibility property and capable of emitting linear light and applicable to the free-curve appearance.

2. Description of Related Art

On the existing market, as the development of light emitting diodes (LEDs) becomes more and more mature, LEDs have more advantages than traditional halogen bulbs, such as small size, high brightness, low power and long service life, etc., as well as more and more extensive applications. At present, in the application of daytime running lights, many car manufacturers use light emitting diodes as the light source of lamps, from the earliest point light source to the current surface light source, 3D stereo light source and linear light source. However, the light emitting diode is a point light source and has directivity. Direct application to the daytime running light will make the lamp body thicker, and there will be obvious granularity in the visual direction. This is because the light cannot achieve a uniform effect, that is, the luminance is not easily reached. The uniform effect causes the visual light body to feel poor, which makes the visual quality of other vehicle drivers and pedestrians worse.

In recent years, the common light guiding strip has been applied to a daytime running light for a vehicle. Since the light of the light source enters the light from the side of the light guiding strip, the visual effect thereof is limited by the length and bending of the light guiding strip. The LED module provided by the present invention presents a linear light source and improves the visual uniformity that cannot be exhibited by traditional design techniques, and increases the identifiability of other vehicles.

In the existing technique, the patent EP 2161494 B1 discloses "LIGHTING DEVICE FOR A MOTOR VEHICLE", and the disadvantages are that in the practical application, it can be found that the LED placement position on the LED strip has deviated from the center position of the light guide body, and the center light exit direction of the LED has deviated from the center axis of the light guide body, resulting in low light output efficiency of the LED. Especially in the center of the light guide, the light intensity is too low to meet the requirements of the daytime running light regulations, or to increase the number of LEDs or use higher power LEDs to achieve the lights regulations.

The U.S. Pat. No. 9,976,710 B2 discloses "FLEXIBLE STRIP LIGHTING APPARATUS AND METHODS", and the disadvantage is that the use of soft materials to add to phosphor powder and pigment materials will lower the overall light intensity, and needs to use multiple LEDs or increase the power value to meet the relevant requirements of the lights regulations, resulting in increased costs.

The CN patent No. 2059793130 discloses "SMD LED FLEXIBLE LIGHT BAR", and the disadvantage disadvantages are as follows: 1. The silica gel illuminating surface is a flat design, and the light emitted by the LED passes through the light surface to cause divergence, which makes it difficult to improve the central light intensity through the daytime running light regulations. 2. To meet the regulatory requirements for daytime running lights for vehicles, it is necessary to increase the number of LEDs significantly, resulting in a significant increase in costs.

The CN patent No. 202158410 U discloses "LED (light emitting diode) FLEXIBLE LAMP BAR ENCAPSULATED BY SILICA GEL", and the disadvantage is that the silica gel illuminating surface is a flat design, which causes the light emitted by the LED to diverge through the illuminating surface. It is necessary to increase the number of LEDs or increase the number of watts to meet the requirements of the daytime running lights.

The CN patent No. CN 107895755 A discloses "HIGH-BRIGHTNESS LED LINEAR LIGHT SOURCE", and the disadvantage is that the light is evenly diffused by using the reflective film method, so that the central light intensity is weak, and it cannot be used in the application of the automobile daytime running light with high requirements for the center (H-V) light intensity, but is more suitable for the high uniformity for in-car backlight module.

The TW patent No. TW 1369463 B1 discloses "ULTRA-THIN LINE LIGHT SOURCE MODULE", and the disadvantage is that the patented package colloid can converge the light of the LED forward light to the center to increase the light intensity, but the convergence of the large angle of the LED is limited, and the center intensity of the structure is about 1.5 more than the design of the planar structure. If user needs to meet the daily light distribution requirements, user needs to increase the number of LEDs or increase the module power, but it will cause increase of cost and poor heat dissipation.

The TW patent No. M474657U discloses "LIGHT GUIDING DEVICE FOR VEHICLE HEADLIGHTS", and the disadvantages are as follows: 1. The light bar emits light toward the left and right sides, and the central light intensity contribution is low, which is difficult to comply with the daytime running light regulations. 2. Two LED strips need to be placed, otherwise the uniform light effect is poor and the brightness is reduced. 3. The light strip is fixed on the back and attached to the back, resulting in poor heat dissipation, unable to use more LEDs or using a higher power current drive.

The TW patent No. 1370216 B1 discloses "LED LIGHTING DEVICE", and the disadvantages are as follows: 1. The middle layer only provides a uniform effect on the color of the light bar, and is more suitable for the backlight module in the car or the interior atmosphere lamp with a relatively uniform color. 2. The shape of the silica gel is a flat design, and there is no effect of collecting light. It is difficult to pass the requirements of the daytime running light regulations.

The CN patent No. 206504276N discloses "LED flashlight lens", and the disadvantages are as follows: 1. This optical design converges the light to increase the illuminating range, but after the angle is reduced, it cannot provide a width of 20 degrees to comply with the daytime running light regulations. 2. Due to the convergence of the light at a small angle, bright spots appear on the lights, causing visually bright and dark differences.

SUMMARY

The primary purpose of the present invention is to provide a vehicle LED linear lighting module, which not only solves the problem of uneven brightness of the automobile signal lamp, but also effectively overcomes the technical problem, and adjusts the LED from the point light source to the linear light source to improve the brightness uniformity of the light exit surface, as well as beautiful appearance. The vehicle LED linear lighting module of the invention is also flexible and effectively applied to daytime running lights, turn lights, tail lights, brake lights, reversing lights, rear fog lights and automobile interior lights; and the flexibility of the vehicle LED linear lighting module can be quickly applied to the free-curve headlights, reducing the size of the module, greatly reducing the size of the lights, increasing space utilization and reducing production costs.

In addition to being able to fully utilize the shape of the lamp of the free curve, the structure of the invention can effectively utilize the space of the lamp body and reduce the thickness of the module, and finally meet the photometry requirements of regulations. In view of the fact that the trend of LED lights on the market is not only for driving safety, but also for visual and entertainment effects, the vehicle LED linear lighting module of the present invention will combine the advantages of the light guide strips to greatly improve the visual uniformity effect, so that the application can be applied to automotive signal lamps and can beautify the appearance, such as: transparent surface, high uniformity visual effects and high light collection efficiency. In addition, the dynamic LED lamp function has been a trend. The invention can combine the functions of the dynamic sequence lighting, the breathing lamp and the flow water light to increase the diversity of the LED lamp, and it is expected to replace the traditional light guide bar in the future and become mainstream products of a linear light source.

According to one exemplary embodiment of the present invention, a vehicle LED linear lighting module is provided, comprising: at least one printed circuit board; at least one light bar, disposed on at least one printed circuit board and composed of a plurality of light emitting diodes in a linear lighting, wherein the plurality of light emitting diodes are electrically connected with the at least one printed circuit board and arranged with equal pitches, and a direction where the plurality of light emitting diodes emit light vertically upward is a first axial direction; an optical colloid, integrally formed on the at least one printed circuit board and covering each of the plurality of light emitting diodes in a full coverage, and comprising: a first optical surface which is the top surface of the optical colloid; a second optical surface which is two side surfaces of the optical colloid extending vertically upward to the at least one printed circuit board; and a third optical surface which is the top surface between the first optical surface and the second optical surface, and is parallel with the surface of the at least one printed circuit board; and a light conductor, disposed on the optical colloid and comprising a light incident surface and a light exit surface, wherein a light path formed of the light incident surface and the light exit surface is parallel with the first axial direction, and an axial direction of the long axis of the light conductor is perpendicular to the first axial direction.

DESCRIPTION OF THE EXEMPLARY EMBODIMENTS

Figure 1A:
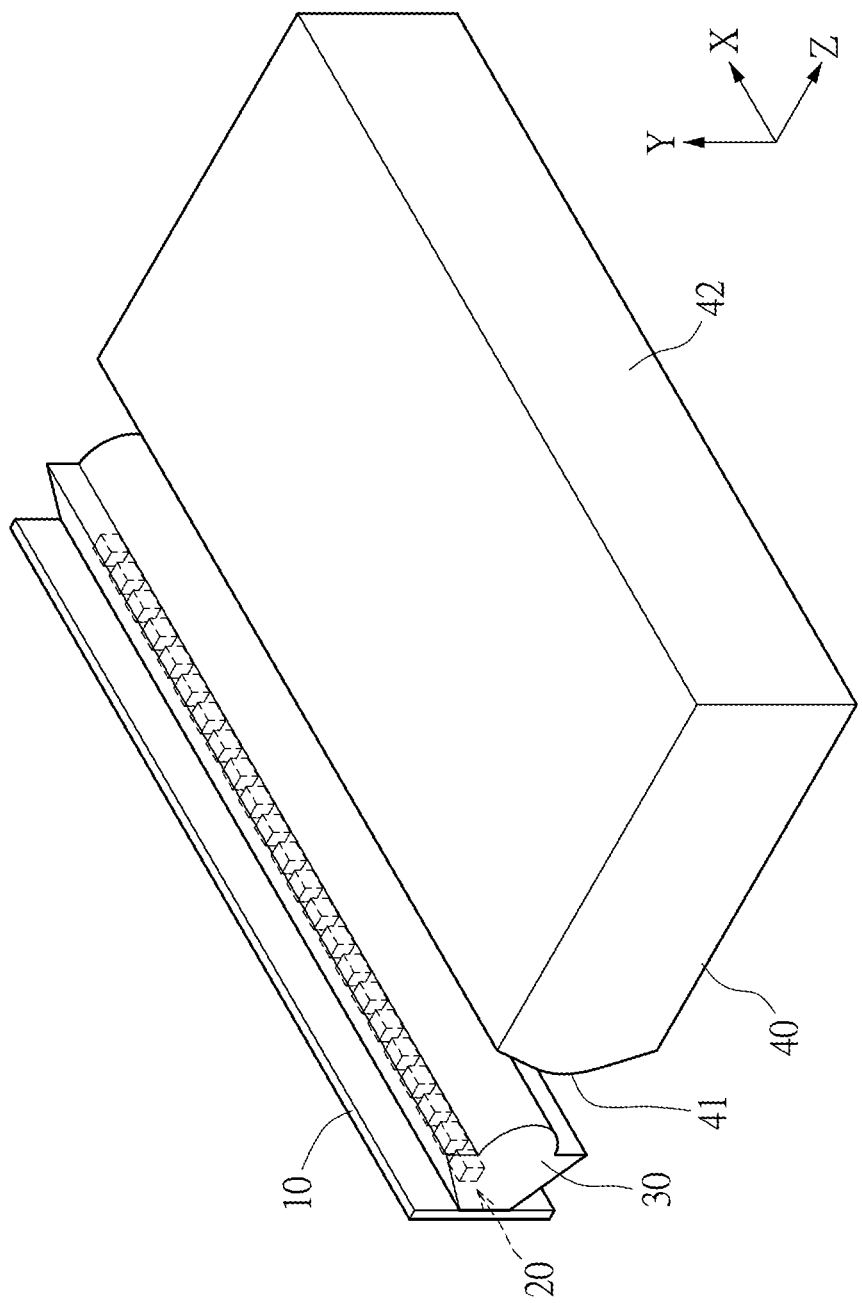
FIG. 1A is a schematic diagram of the structure of the vehicle LED linear lighting module according to an exemplary embodiment of the present invention.
Figure 1B:
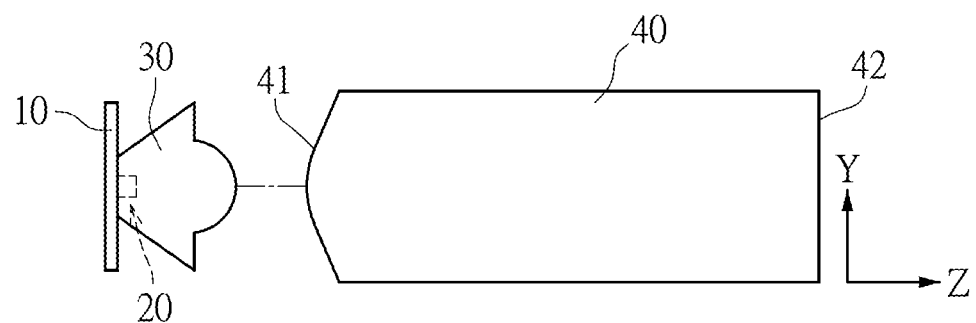
FIG. 1B is a side view of the vehicle LED linear lighting module according to an exemplary embodiment of the present invention.
Figure 1C:
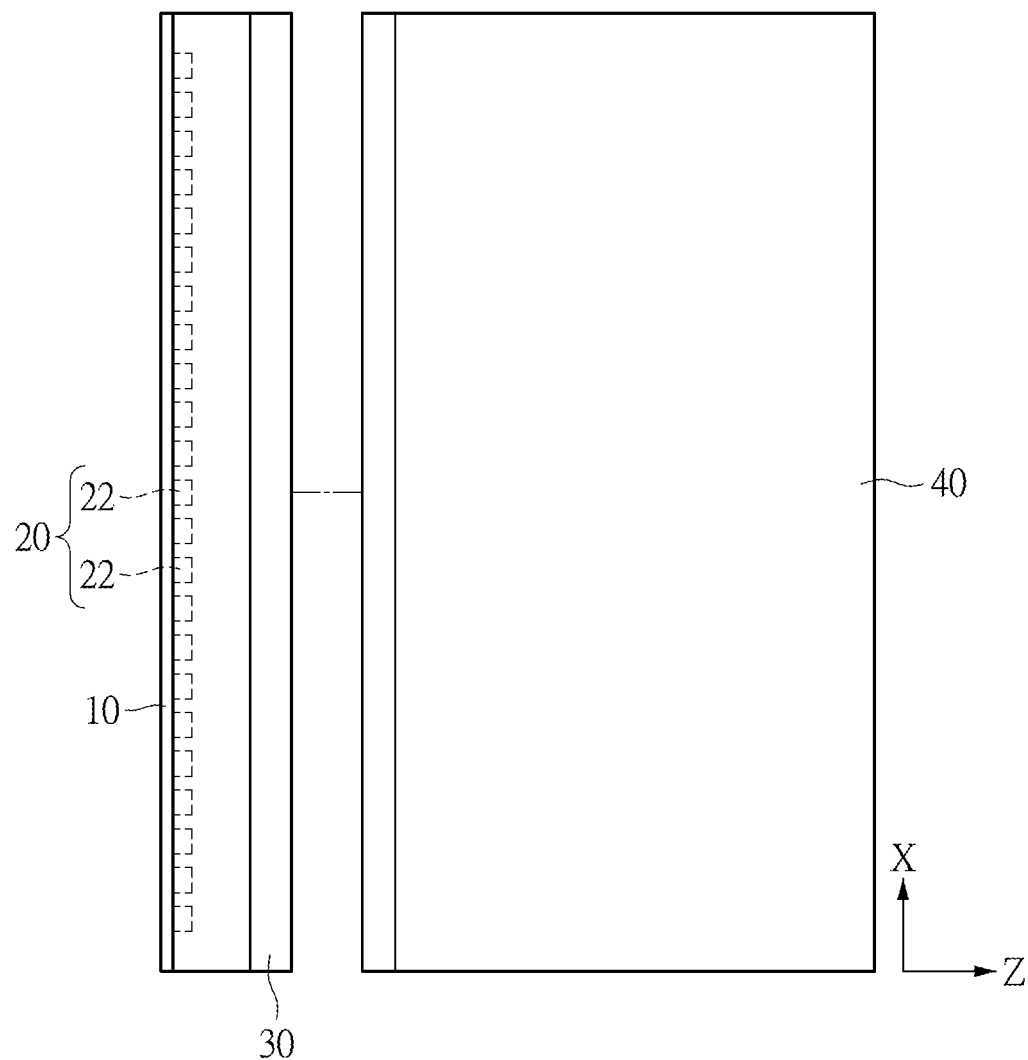
FIG. 1C is a top view of the vehicle LED linear lighting module according to an exemplary embodiment of the present invention.
Figure 1D:
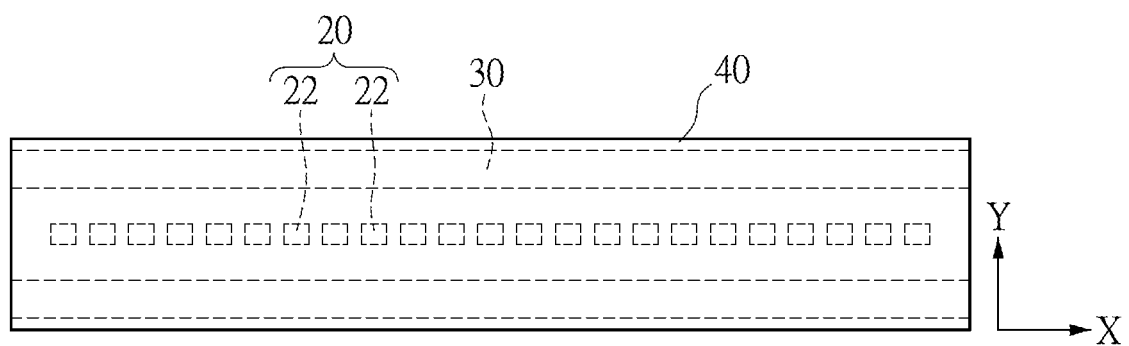
FIG. 1D is a horizontal top view of the vehicle LED linear lighting module according to an exemplary embodiment of the present invention.

Because the brightness of the daytime running light of the light-guide strip type on the market is not uniform and the brightness is evenly poor, the present invention provides a vehicle LED linear lighting module which can generates a LED linear light source having high brightness and high brightness uniformity, and the main feature is that the longitudinal direction is uniform, which makes the linear light source have good visual effect and meets the requirements of light distribution regulations. Compared with the general LED light bar, the present invention can improve the light intensity of the linear light source, module integration and meet the regulations of the light distribution regulations. The linear light source of the present invention has flexibility and can be applied to a free-form exterior model, so that the automobile designer can have more creative ideas.

The exemplary embodiments are described more fully hereinafter with reference to the accompanying drawings. However, the inventive concept may be embodied in many different forms and should not be construed as limited to the illustrative embodiments set forth herein. To be more precisely, these exemplary embodiments are provided so that this description will be in the drawings, the size of the light emitting diode, the printed circuit board, the optical colloid, and the light conductor and the corresponding positional distances may be schematically illustrated for clarity, wherein similar or similar relationships are always indicated for similar English numerals or numbers, components.

It will be understood that, although the terms may be used herein to include the first, second, third, etc., the terms are used to clearly distinguish one element from another, and not the order of the number of the elements. Relationships, such as above or below the terms used herein, vertically or horizontally, etc., are used to clearly distinguish one side and the end of an element from the other side and end of the element, or to distinguish one The relative relationship between the corresponding position of the component and the other component is not used to limit the sequential relationship or relative positional relationship of the character number, and does not necessarily have a numerically continuous relationship; that is, by another From an angle of view, the upper (or lower) of the description element may be referred to as being below (or above) without affecting the nature of the technology; again, the first axis is used herein, for example, term of a Z-axis, which is merely an example. It is explained that the spatial position described is known, that is, the first axial direction may also be the Y-axis or the X-axis, depending on the angle of the observer. Furthermore, the term "at least one of" may be used herein to describe a technique that is implemented with one or more elements. In addition, in the following description, the term "plurality" is used to describe a plurality of, but the plural is not limited to the implementation of a technique in which two, three or four and four or more numbers are implemented.

Reference is made to FIGS. 1A, 1B, 1C and 1D. A vehicle LED linear lighting module according to an embodiment of the present invention includes at least one printed circuit board 10, at least one light bar 20, an optical colloid 30, and at least one light conductor 40. In practice, the printed circuit board 10 may be a single copper foil PCB, a FR4 PCB, a flexible PCB (FPCB), a metal core PCB (MCPCB), or a multi copper foils PCB which is used to increase thermal conductivity or design flexibility of circuit trace, or to improve electromagnetic protection.

The at least one light bar 20 is disposed on the at least one printed circuit board 10, and in practice, may be a structure in which a single light bar, two light bars or multiple light bars are arranged in a parallel manner. In addition, two light bars disposed on the at least one light bar 20 may be a light emitting diode emitting a single light color or different light colors. For example, the light bar disposed in a first row emits white light and the light bar disposed in a second row emits red light. The at least one light bar 20 can be designed to emit various light colors according to actual requirements and the present invention is not limited thereto. Further, the at least one light bar 20 is composed of a plurality of light emitting diodes 22 in a linear lighting, and the plurality of light emitting diodes 22 can be implemented as an LED die, that is, an LED die that has not been packaged. In the present invention, the optical colloid 30 can be used as a packaging material for packaging the LED die in packaging processes. Besides, the plurality of light emitting diodes 22 can also be an LED light emitting element which has been packaged, and the present invention is not limited thereto. LED dies or LED light emitting elements are employed depending on the needs of the designer.

The plurality of light emitting diodes 22 are electrically connected to the printed circuit board 10, that is, the printed circuit board 10 provides power and control signals required for the plurality of light emitting diodes 22 to drive illumination. In addition, the distance between the plurality of light emitting diodes 22 is an equal interval, and the pitch refers to the distance between the adjacent side and the adjacent side between each two adjacent light emitting diodes in the present invention is an equal spacing. In practical applications, take one embodiment for example, when the size of each of the plurality of light emitting diodes 22 is 3.5 mm in length and 2.8 mm in width (that is, commonly referred to as 3528 LED), the spacing is 3 mm. However, the LED size and the spacing are only an embodiment, and the scope of practical use of the present invention is not limited by the LED size and the spacing. In addition, a direction in which each of the plurality of light emitting diodes 22 emits light vertically upward is a first axial direction, for example, a Z-axis as shown in FIG. 1A; that is, the first axial direction is Z axis.

The optical colloid 30 is directly integrally formed on the printed circuit board 10, and covers each of the plurality of light emitting diodes 22 in a full coverage; that is, each surface of each of the plurality of light emitting diodes 22, such as the upper, the front, the back, the left, and the right of an LED, is covered by the optical colloid 30. In practical use, the optical colloid 30 is a transparent, translucent or matte material, and may be a flexible material such as silica gel.

Figure 7:
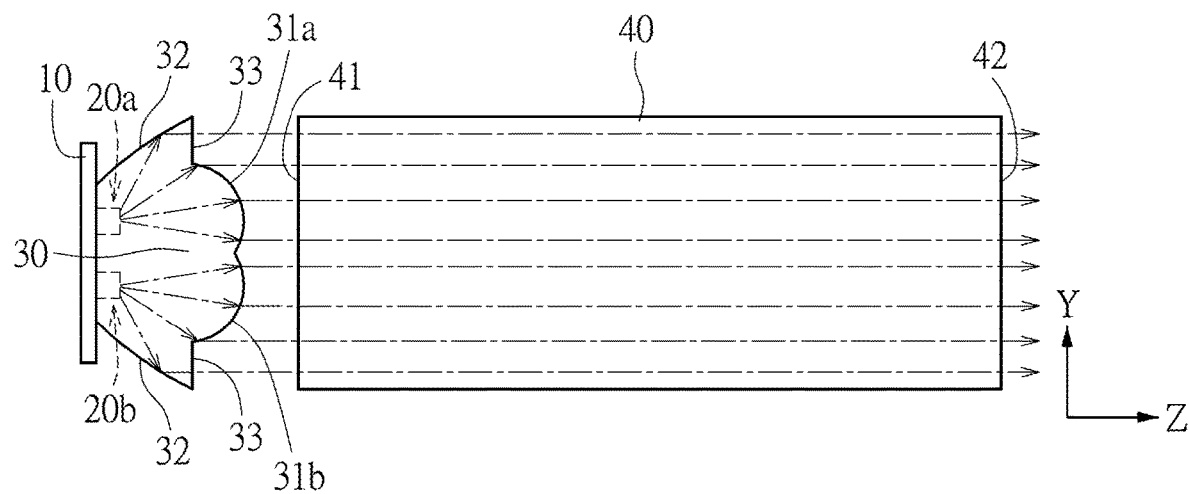
FIG. 7 is a side view according to a second exemplary embodiment of the present invention.
Figure 8:
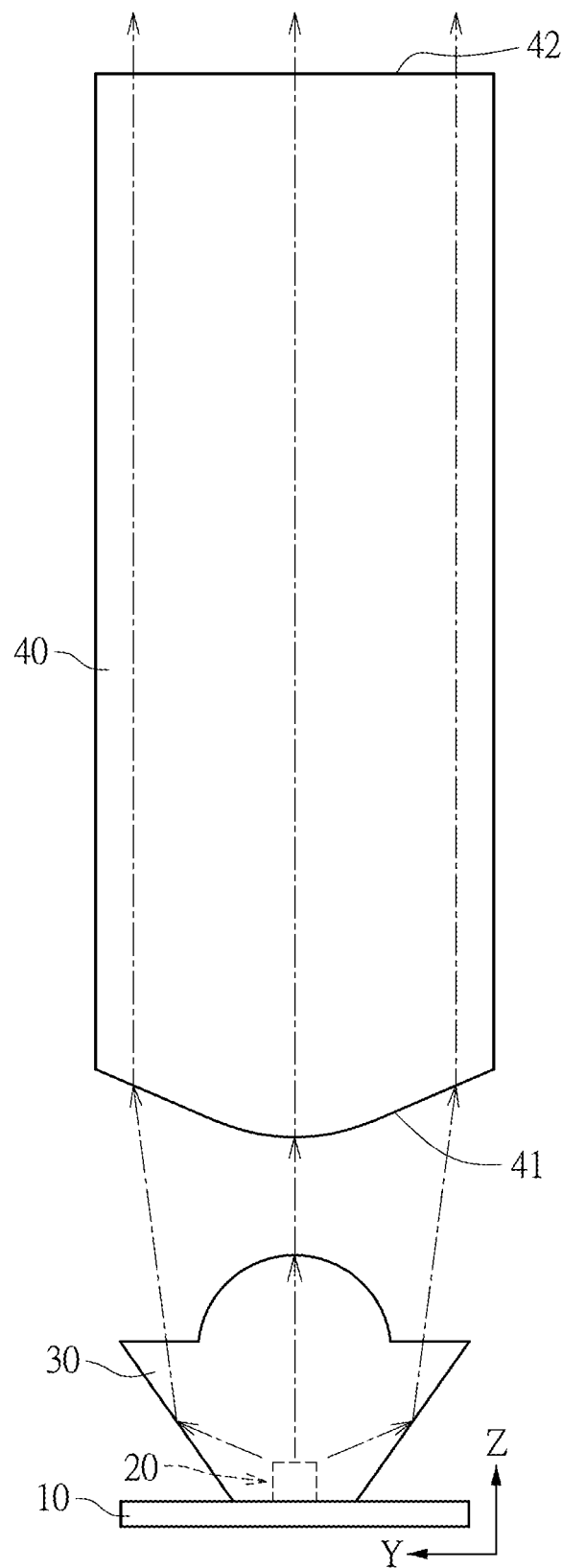
FIG. 8 is a side view according to a third exemplary embodiment of the present invention.

The light conductor 40 is disposed above the optical colloid 30. The light conductor 40 includes a light incident surface 41 and a light exit surface 42. A light path formed of the light incident surface 41 and the light exit surface 42 is parallel to the first axial direction (as shown in FIGS. 7 and 8), i.e., parallel to the Z axis. An axial direction of the long axis of the light conductor 40 (as shown in the X axis of FIG. 1A) is perpendicular to the first axial direction; that is, the light conductor 40 is a long strip structure, and a length direction where the strip shape extends is the direction of the X-axis. In practical uses, the light conductor 40 is a transparent, translucent or matte optical component such as lamp housing, a light guide or an optical lens.

The vehicle LED linear lighting module shown in FIG. 1A to FIG. 1D can be mounted on a vehicle body or any object having a directional light distribution requirement, for example, daytime running lights (DRL), turn lights, position lights, tail lights, stop lights, backup lights, rear fog lights, interior lights . . . etc. for a vehicle. Moreover, the present invention can be installed on any luminaire with a curved surface and meets the photometry requirements of regulations. Besides, the vehicle LED linear lighting module can be set to have the effect of dynamic sequence, such as flow water lights or breathing lights.

Figure 2:
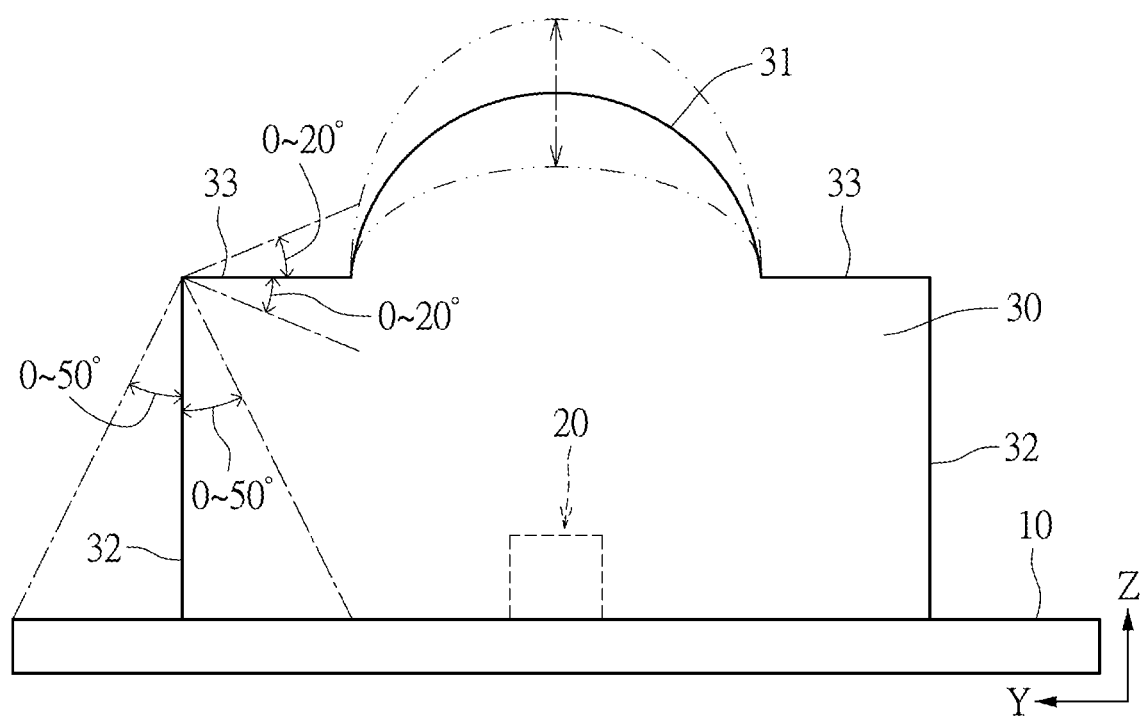
FIG. 2 is a schematic diagram of the optical surface at different angles according to an exemplary embodiment of the present invention.

As shown in FIG. 2, the optical colloid 30 of the present invention includes a first optical surface 31, a second optical surface 32, and a third optical surface 33. The first optical surface 31 is the top surface of the optical colloid 30, the second optical surface 32 is two side surfaces of the optical colloid 30 extending vertically upward to a surface of the printed circuit board 30, and the third optical surface 33 is the top surface between the first optical surface 31 and the second optical surface 32, and is parallel to the face of the printed circuit board 10. The material used in the optical colloid 30 is a silica gel having high light transmittance. The appearance of the optical colloid 30 needs to be optically designed, and the structure of the light conductor 40 is used to effectively utilize the light of the colloidal light surface to increase the optical utilization, making that the vehicle LED linear lighting module has a linear light source effect of high brightness, high light intensity and high luminance uniformity, and is applicable to the vehicle lamp and can meet the light distribution regulations.

The present invention also discloses a method for integrally forming the optical colloid 30 and the printed circuit board 10, so that the plurality of light emitting diodes 22 can be completely embedded in the optical colloid 30. That is, the optical colloid 30 is, in practice, formed on the printed circuit 10 to cover the printed circuit board 10 on which the light bar 20 is disposed, with a columnar mold having an inner portion of the first optical surface 31, the second optical surface 32, and the third optical surface 33, and thereafter, glue is injected to the columnar mold. The columnar mold is removed after the optical colloid 30 is formed, so that the optical colloid 30 and the printed circuit board 20 are integrally formed and the plurality of light emitting diodes 22 are embedded in the optical colloid 30. In another embodiment, the optical colloid 30 and the printed circuit board 10 are integrally formed by integral injection molding, and the light bar 20 is embedded in the optical colloid 30.

Furthermore, different angular ranges of embodiments of the first optical face 31, the second optical face 32, and the third optical face 33 are disclosed in FIG. 2. The first optical surface 31 is a plane, a curved surface, a spherical surface, an elliptical surface or an aspherical curved surface, as shown by the dashed line of the upper and lower circular arcs of the first optical surface 31 in FIG. 2. The structure of the second optical surface 32 perpendicular to the side surface of the printed circuit board 10 can be implemented as an inclined surface which is a fixed point above and a lower end which is in contact with the printed circuit board 10, an inclined surface that is inclined outwardly or inwardly, as shown by the broken line in FIG. 2, and the angle of the inclined surface is between ±50 degrees; that is, the inclined surface may be a vertical surface and an outwardly inclined surface, or the side is inclined to the inside. The plane of the third optical surface 33 parallel to the printed circuit board 10 may be an inclined surface which is a fixed point in contact with the end point of the second optical surface 32, and the surface formed by the end point in contact with the first optical surface 31 is parallel to the Y-axis, or is inclined upward and downward, and the angle of the inclined surface is between ±20 degrees, as shown in FIG. 2.

Figure 3:
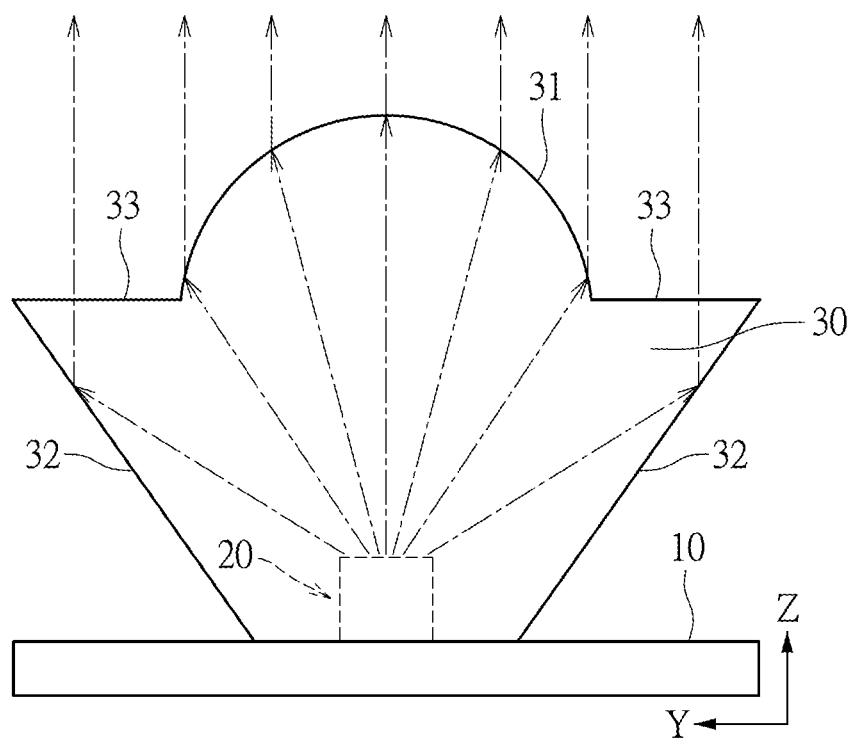
FIG. 3 is a schematic diagram of the structure of the optical colloid according to an exemplary embodiment of the present invention.

FIG. 3 illustrates the different effects that can be produced by the structure of the optical colloid 30 in the present invention. The outer structure of the optical colloid 30 is a condensing type, and the first optical surface 31 functions to receive a small angle of light emitted by the light source. The second optical surface 32 receives the large-angle light emitted by the light source, so that the light can be effectively utilized; and the third optical surface 33 is the light-emitting surface after the large-angle light passes through the second optical surface 32. Such an arrangement can increase the width of the gel and enhance the overall visual effect, so that the visual effect of the daytime running light of the vehicle presents a uniform linear light source and meets the requirements of the regulations.

Figure 4A:
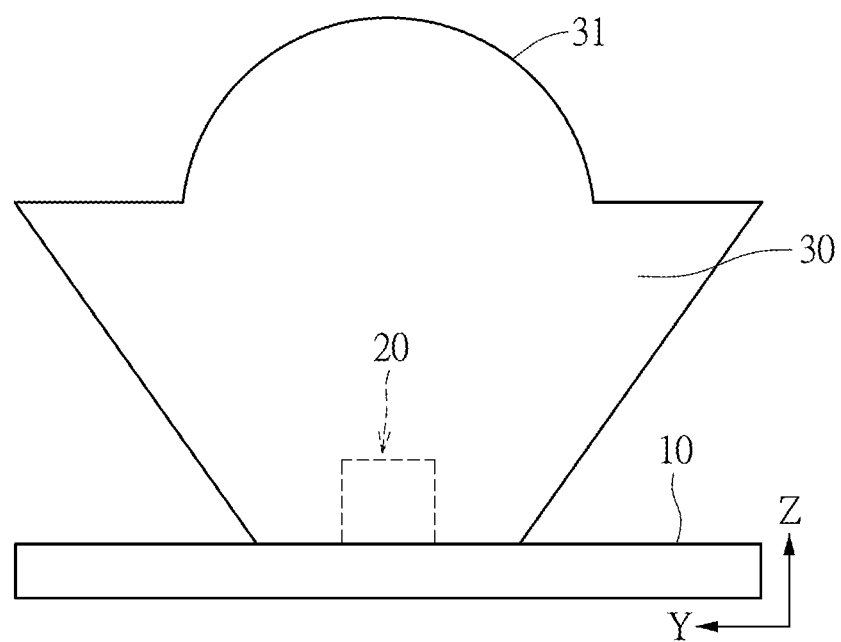
FIG. 4A is a schematic diagram of the first optical surface according to an exemplary embodiment of the present invention.
Figure 4B:
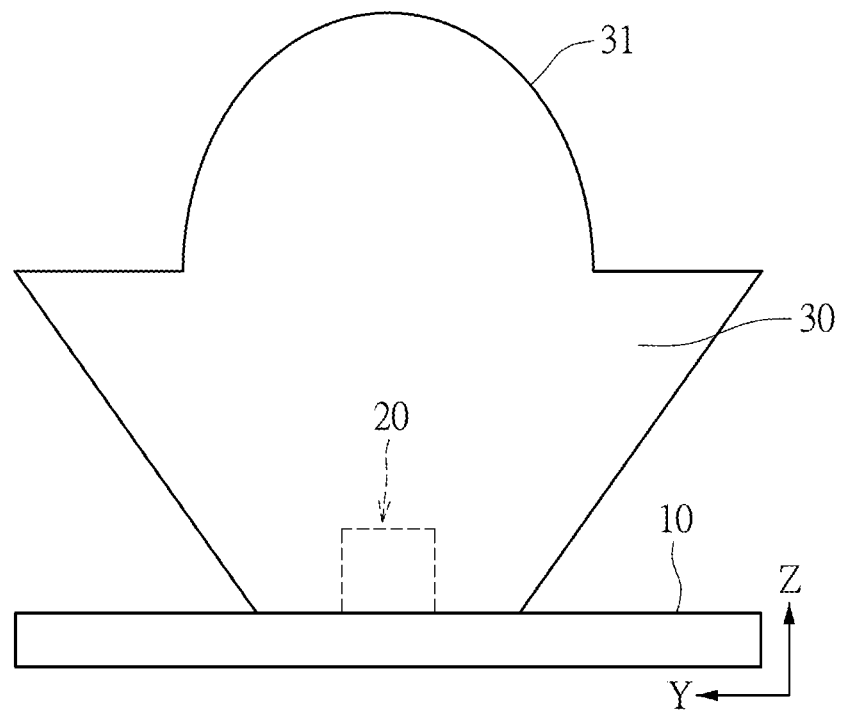
FIG. 4B is a schematic diagram of the first optical surface according to another exemplary embodiment of the present invention.
Figure 4C:
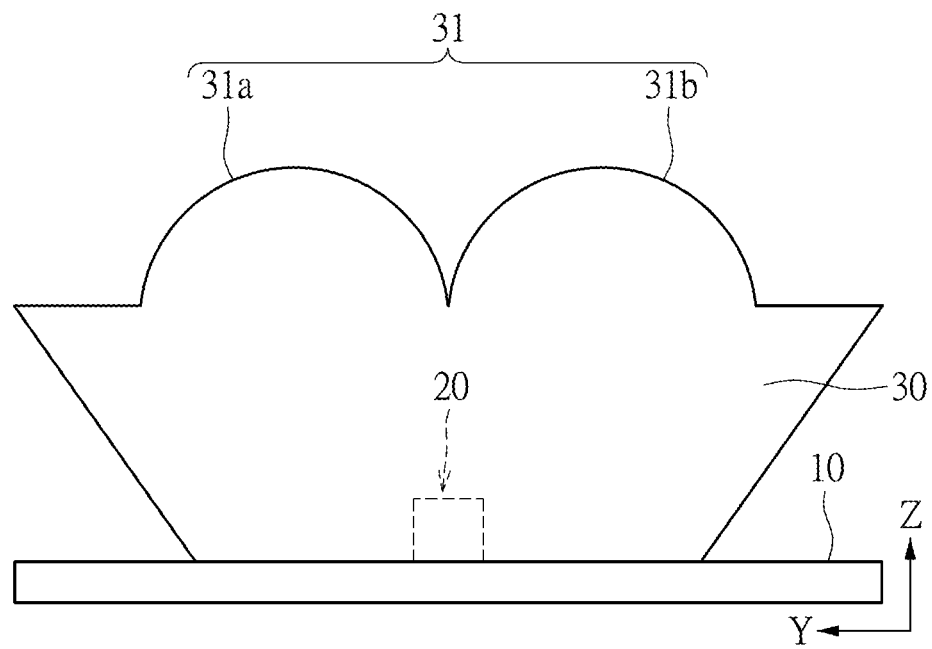
FIG. 4C is a schematic diagram of the first optical surface according to yet another exemplary embodiment of the present invention.
Figure 4D:
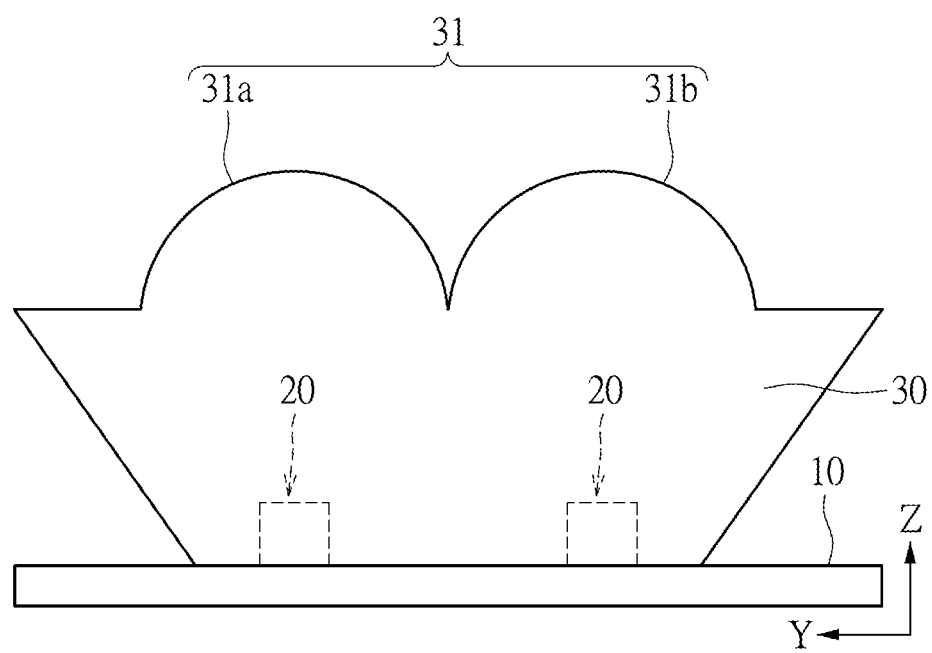
FIG. 4D is a schematic diagram of two light bars corresponding to FIG. 4C.

FIGS. 4A, 4B, 4C, and 4D are structural views further illustrating different embodiments of the first optical surface 31 of the present invention. The first optical surface 31 of the optical colloid 30 can be a curved surface or a flat surface, and the curved surface type is spherical or aspherical. The main purpose is to adjust the main light distribution of the light source in the Y-axis according to the designer's needs; for example: an illuminating angle of LED is 155 degrees, and after cooperating with the first optical surface 31 of the present invention, the illuminating angle is reduced to 20 degrees, and the light intensity is increased by more than 100%. FIG. 4A is different from FIG. 4B in that the curvature of the circular arc is different, and FIG. 4C is a modeling structure in which the first optical surface 31 is designed as a continuous arc having the first optical A surface 31a and the first optical B surface 31b. It is a circular arc structure with a continuous biconvex curved surface, and the double circular arc structure can further be applied with an embodiment of the double concentrating effect of the dual-row light bar structure. FIG. 4D is the first optical A surface 31a and the first optical B surface 31b of a circular arc structure having a biconvex curved surface, the difference is that the light bar 20 is designed as a double light strip, and the light of each of the light strips 20 corresponds respectively to the first optical A surface 31a and the first optical B surface 31b to perform a light condensing action.

Figure 5A:
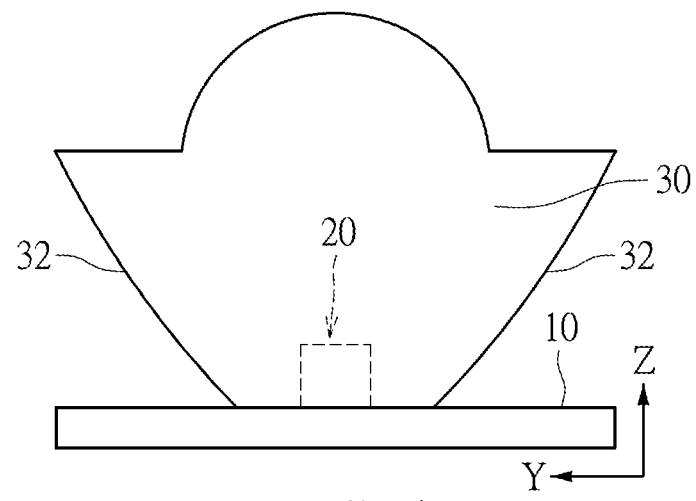
FIG. 5A is a schematic diagram of the second optical surface according to an exemplary embodiment of the present invention.
Figure 5B:
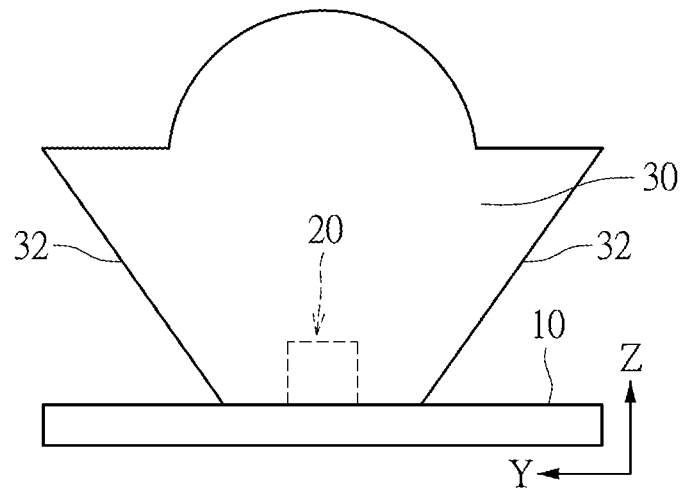
FIG. 5B is a schematic diagram of the second optical surface according to another exemplary embodiment of the present invention.
Figure 5C:
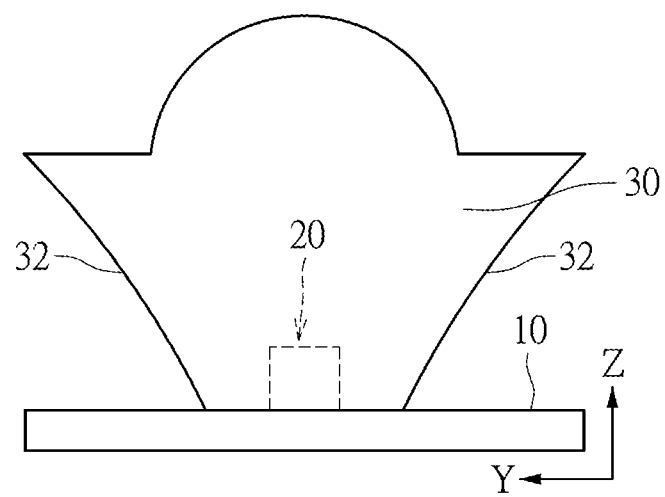
FIG. 5C is a schematic diagram of the second optical surface according to yet another exemplary embodiment of the present invention.

FIGS. 5A, 5B, and 5C are structural views further illustrating different embodiments of the second optical surface 32 of the present invention. The second optical surface 32 is a vertical surface, a slanted surface, a concave curved surface or a convex curved surface, and the main reason is that the Y-axis large-angle light can be slightly adjusted according to the use requirement; for example, the LED illuminating angle is 155 degrees. When the second optical surface 32 of the present invention is used, the illuminating angle is reduced to 30 degrees, and the light intensity is increased by more than 70%. In addition, if the first optical surface 31 and the second optical surface 32 are simultaneously used, the illuminating angle in the Y-axis can be reduced to 20 degrees, and the maximum light intensity is increased by more than 200%. When the light is reduced to be within 10 degrees, it is easy to meet the regulatory requirements for daytime running lights. The second optical surface 32 of FIG. 5A is an obliquely curved surface, the second optical surface 32 of FIG. 5B is an oblique plane inclined to the inner side, and the second optical surface 32 of FIG. 5C is a concave curved surface.

Figure 6A:
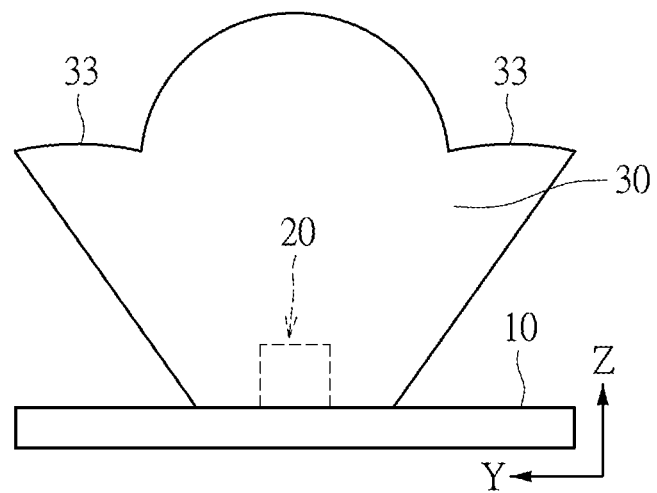
FIG. 6A is a schematic diagram of the third optical surface according to an exemplary embodiment of the present invention.
Figure 6B:
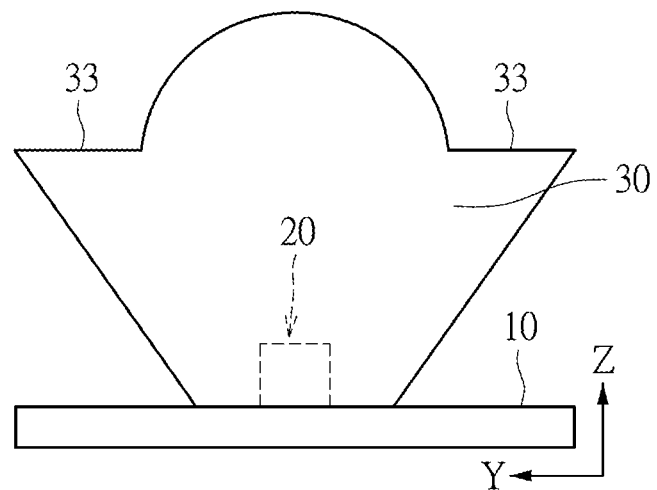
FIG. 6B is a schematic diagram of the third optical surface according to another exemplary embodiment of the present invention.
Figure 6C:
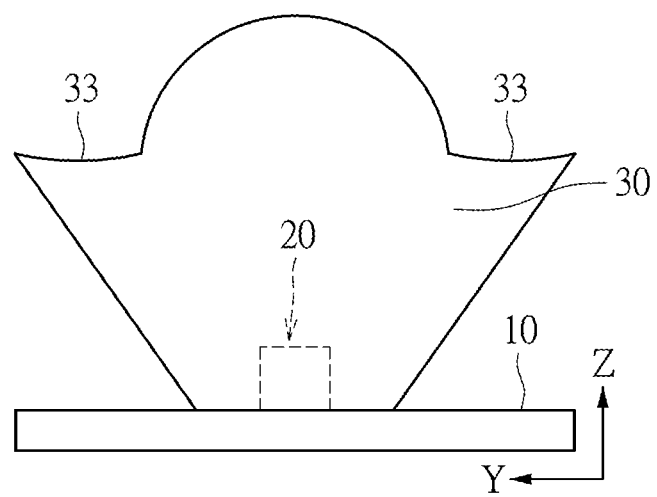
FIG. 6C is a schematic diagram of the third optical surface according to yet another exemplary embodiment of the present invention.
Figure 6D:
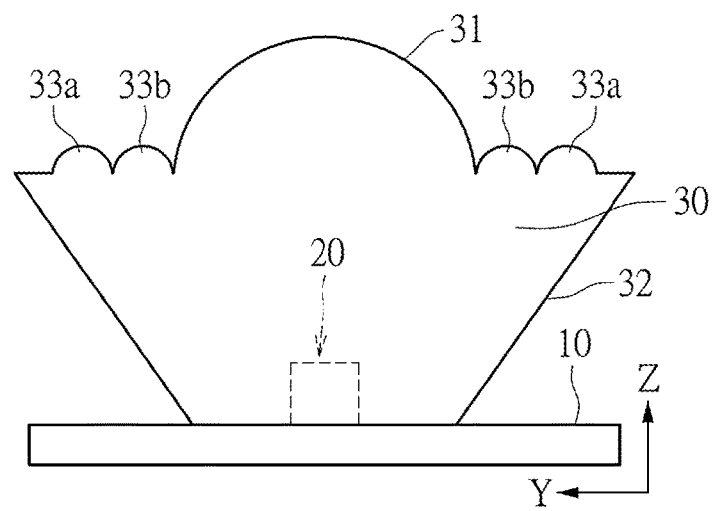
FIG. 6D is a schematic diagram of the third optical surface according to another exemplary embodiment of the present invention.

FIGS. 6A, 6B, 6C, and 6D are structural views further illustrating different embodiments of the third optical surface 33 of the present invention. The third optical surface 33 can be a plane, a convex curved surface or a concave curved surface. The main consideration is that the light distribution and the visual uniformity of the Y axis can be adjusted according to the needs of the user. In FIG. 6A, the third optical surface 33 is a convex curved surface, the third optical surface 33 of FIG. 6B is a flat surface, the third optical surface 33 of FIG. 6C is a concave curved surface, and the third optical surface 33 of FIG. 6D individually includes a third optical A surface 33a and a third optical B surface 33b, and the third optical A surface 33a and the third optical B surface 33b are continuous arcuate biconvex curved surfaces.

FIG. 7 is a side view of a second embodiment of the present invention in which a printed circuit board 10, a first light strip 20a, a second light strip 20b, an optical colloid 30, and a light conductor 40 are included. The second embodiment of the present invention is different from the first embodiment in that the light bar 20 is partially provided with a first light bar 20a and a second light bar 20b, and the first optical surface 31 of the optical colloid 30 is provided with the foregoing structure of a continuous convex arc of the first optical A surface 31a and the first optical B surface 31b. The second embodiment functions as a light strip using two different color LEDs on the printed circuit board 10. The optical colloid 30 has an outer shape that adjusts the first optical surface 30 to a hyperboloid to correspond to two different colors, so as to increase light efficiency and light intensity. Further, the first optical A surface 31a is a light condensing effect corresponding to the first light bar 20a, and the first optical B surface is a light condensing effect corresponding to the second light bar 20b.

FIG. 8 is a side view showing the structure of a third embodiment of the present invention. The difference from the first embodiment is that the light incident surface 41 of the light conductor 40 is a convex curved surface; that is, the light incident surface 41 of the light conductor 40 can be a plane, a convex curved surface or a concave curved surface; likewise, the light exit surface 42 of the light conductor 40 can also be a plane, a concave curved surface or a convex curved surface. In practical applications, the overall device of the present invention can be combined with the light incident surface 41 and the light exit surface 42 of the light conductor 40 (for example, an outer lamp housing, an inner lamp housing, an optical lens or a transparent optical plastic member). The type can be individually flat, convex or concave and the curvature can be set according to actual needs.

Figure 9:
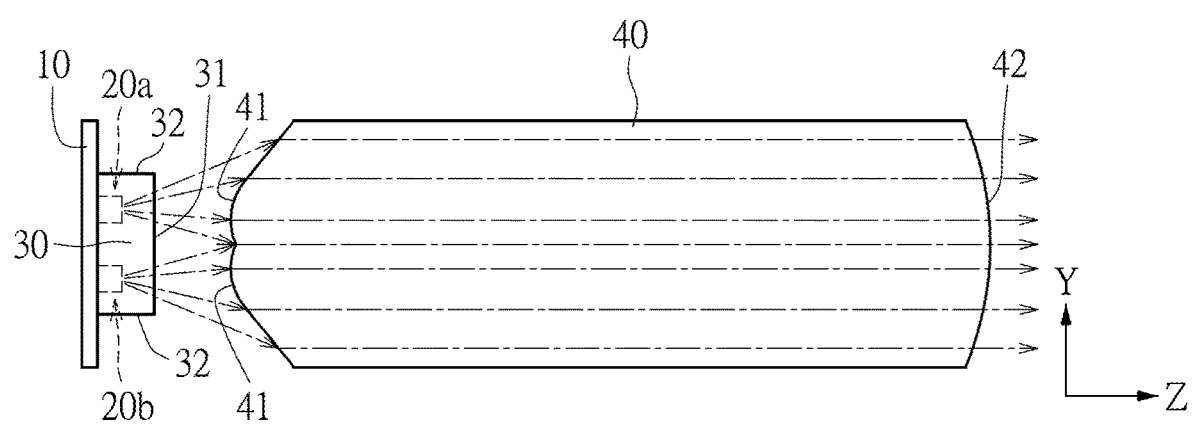
FIG. 9 is a side view according to a fourth exemplary embodiment of the present invention.

FIG. 9 is a side view showing a structure of a fourth embodiment of the present invention in which at least one printed circuit board 10, a first light bar 20a and a second light bar 20b, and at least one optical colloid 30 are included. The optical colloid 30 has the first optical surface 31, the second optical surface 32 and at least one light conductor 40. The fourth embodiment of the present invention is different from the first embodiment in that the light bar 20 is provided with a first light bar 20a and a second light bar 20b. Similarly, the first light bar 20a and the second light bar 20b are arranged in parallel and are disposed on the printed circuit board 10; the first light bar 20a and the second light bar 20b are composed of the plurality of light emitting diodes 22. The plurality of light emitting diodes 22 are formed in a linear arrangement. The plurality of light emitting diodes 22 are electrically connected to the printed circuit board 10, and the distance between the plurality of light emitting diodes 22 is an equal interval.

The optical colloid 30 of the fourth embodiment has only the first optical surface 31 and the second optical surface 32, wherein the first optical surface 31 is the top surface of the optical colloid 30, and is a plane parallel to the Y-axis; the second optical surface 32 is two side surfaces of the optical colloid 30 extending vertically upward to the printed circuit board 10, and the two side surfaces are perpendicular to the Y-axis. Similarly, the optical colloid 30 is directly formed on the printed circuit board 10, and covers all of the plurality of light-emitting diodes 22 in the first light bar 20a and the second light bar 20b in a full coverage. The light incident surface 41 of the light conductor 40 is a biconvex curved surface, and the light exit surface 42 of the light conductor 40 is a single convex curved surface, wherein a light path formed of the biconvex curved surface of the light incident surface 41 of the optical conductor 40 and the single convex curved surface of the light exit surface 42 of the optical conductor 40 is parallel to the first axis (i.e., the Z axis). The light conductor 40 is also in the form of a strip having an axial direction of the long axis (i.e., the X axis) perpendicular to the first axis, and the light incident surface 41 of the light conductor 40 has a biconvex curved surface structure, mainly corresponding to the illuminating angles of the first light bar 20a and the second light bar 20b respectively, and proving the function of collecting light and condensing light.

In summary, the vehicle LED linear lighting module of the present invention has the advantages of good visual effect, no darkening of the conduction distance of the light guiding strip, small size of the module, flexible and easy to match various free-curve shapes, and the like. Such advantages let the car factory in the design of the appearance of the lights can have more diverse creative thinking. The optical colloid 30 and the light conductor 40 are added to the light bar 20 by using different optical surfaces of the optical colloid 30, so that the light bar 20 can greatly improve the light effect, and the module has the effect of high brightness and high uniformity, and the application of the lamp can meet the strict high light intensity requirements of the lamp light distribution regulations and has excellent visual effects. Obviously, the invention has extremely high requirements for patent application.

The above-mentioned descriptions represent merely an exemplary embodiment of the present invention, without any intention to limit the scope of the present invention thereto. Various equivalent changes, alterations or modifications based on the claims of the present invention are all consequently viewed as being embraced by the scope of the present invention.

What is claimed is:

1. A vehicle LED linear lighting module, comprising:
   at least one printed circuit board;
   at least one light bar, disposed on at least one printed circuit board and composed of a plurality of light emitting diodes in a linear lighting, wherein the plurality of light emitting diodes are electrically connected with the at least one printed circuit board and arranged with equal pitches, and a direction where the plurality of light emitting diodes emit light vertically upward is a first axial direction;
   an optical colloid, integrally formed on the at least one printed circuit board and covering each of the plurality of light emitting diodes in a full coverage, and comprising:
     a first optical surface which is the top surface of the optical colloid;
     a second optical surface which is two side surfaces of the optical colloid extending vertically upward to the at least one printed circuit board; and
     a third optical surface which is the top surface between the first optical surface and the second optical surface, and is parallel with the surface of the at least one printed circuit board; and
   a light conductor, disposed on the optical colloid and comprising a light incident surface and a light exit surface, wherein a light path formed of the light incident surface and the light exit surface is parallel with the first axial direction, and an axial direction of the long axis of the light conductor is perpendicular to the first axial direction.

2. The vehicle LED linear lighting module according to claim 1, wherein a columnar mold having an inner portion of the first optical surface, the second optical surface and the third optical surface inside thereof is provided to cover the at least one printed circuit board on which the at least one light bar is disposed, glue is injected to the columnar mold, and the columnar mold is removed after the optical colloid is formed, so that the optical colloid and the at least one printed circuit board are integrally formed and the plurality of light emitting diodes are embedded in the optical colloid.

3. The vehicle LED linear lighting module according to claim 1, wherein the first optical surface is an arc surface having a curved surface, a spherical surface, an elliptical surface or an aspherical curved surface; the second optical surface is perpendicular to a side surface of the at least one printed circuit board and the side surface is an inclined surface having an angle between ±50 degrees; and the third optical surface is parallel to a surface of the at least one printed circuit board and the surface is an inclined surface having an angle between ±20 degrees.

4. The vehicle LED linear lighting module according to claim 1, wherein the at least one light bar is a dual-row structure having a first light bar and a second light bar arranged in a parallel manner, or a structure having a plurality of light bars arranged in a parallel manner; and wherein each light bar is a light emitting diode emitting a single light color or different light colors.

5. The vehicle LED linear lighting module according to claim 1, wherein the first optical surface is a curved surface or a plane; the second optical surface is a vertical surface, a sloped surface, a concave curved surface or a convex curved surface; and the third optical surface is a plane, a convex curved surface, or a concave curved surface.

6. The vehicle LED linear lighting module according to claim 1, wherein the first optical surface comprises a first optical A surface and a first optical B surface, and the first optical A surface and the first optical B surface are continuous arcuate biconvex curved surfaces.

7. The vehicle LED linear lighting module according to claim 1, wherein the third optical surface comprises a third optical A surface and a third optical B surface, and the third optical A surface and the third optical B surface are continuous arcuate biconvex curved surfaces.

8. The vehicle LED linear lighting module according to claim 1, wherein the light incident surface of the light conductor is a plane, a concave curved surface, or a convex curved surface, and the light exit surface of the light conductor is a plane, a concave curved surface, or a convex curved surface.

9. The vehicle LED linear lighting module according to claim 6, wherein the at least one light bar is a dual-row structure having a first light bar and a second light bar arranged in a parallel manner, and the first optical A surface provides a light condensing effect corresponding to the light emission of the first light bar and the first optical B surface provides a light condensing effect corresponding to the light emission of the second light bar.

10. The vehicle LED linear lighting module according to claim 1, wherein when a size of each of the light emitting diodes is 3.5 mm in length and 2.8 mm in width, each equal pitch between two adjacent light emitting diodes of the plurality of the light emitting diodes is ≤3 mm.

11. A vehicle LED linear lighting module, comprising:
at least one printed circuit board;
a first light bar and a second light bar, arranged in a parallel manner and disposed on the at least one printed circuit board; wherein the first light bar and the second light bar are both formed of a plurality of light emitting diodes in a linear lighting, and the plurality of light emitting diodes are electrically connected with the at least one printed circuit board and arranged with equal pitches, and a direction where the plurality of light emitting diodes emit light vertically upward is a first axial direction;
an optical colloid, integrally formed on the at least one printed circuit board and covering each of the plurality of light emitting diodes in a full coverage, and comprising:
a first optical surface which is the top surface of the optical colloid;
a second optical surface which is two side surfaces of the optical colloid extending vertically upward to the at least one printed circuit board; and
a light conductor, disposed on the optical colloid and comprising a light incident surface and a light exit surface, wherein a light path formed of the light incident surface and the light exit surface is parallel with the first axial direction, and an axial direction of the long axis of the light conductor is perpendicular to the first axial direction; and wherein the light incident surface of the light conductor is a structure having a biconvex curved surface which provides a light condensing effect corresponding to the first light bar and the second light bar respectively; and
wherein a columnar mold having an inner portion of the first optical surface and the second optical surface inside thereof is provided to cover the at least one printed circuit board on which the at least one light bar is disposed, glue is injected to the columnar mold, and the columnar mold is removed after the optical colloid is formed, so that the optical colloid and the at least one printed circuit board are integrally formed and the plurality of light emitting diodes are embedded in the optical colloid.

* * * * *

UNITED STATES PATENT AND TRADEMARK OFFICE
CERTIFICATE OF CORRECTION

PATENT NO. : 10,578,271 B1  
APPLICATION NO. : 16/387129  
DATED : March 3, 2020  
INVENTOR(S) : Yu-Chu Chen, Jhen-Cyun Lyu and Sheng-Hua Yang Page 1 of 1

It is certified that error appears in the above-identified patent and that said Letters Patent is hereby corrected as shown below:

On the Title Page

In the Foreign Patent documents on page 2, Column 2, Line 9, the reference should read:
EP 2378187 A1 10/2011

Signed and Sealed this
Fifth Day of May, 2020

Andrei Iancu
*Director of the United States Patent and Trademark Office*